(12) United States Patent
Lin

(10) Patent No.: US 11,120,848 B2
(45) Date of Patent: Sep. 14, 2021

(54) METHOD FOR DETERMINING A PROPER PROGRAM VOLTAGE FOR A PLURALITY OF MEMORY CELLS

(71) Applicant: eMemory Technology Inc., Hsin-Chu (TW)

(72) Inventor: I-Lang Lin, Hsinchu County (TW)

(73) Assignee: eMemory Technology Inc., Hsin-Chu (TW)

(*) Notice: Subject to any disclaimer, the term of this patent is extended or adjusted under 35 U.S.C. 154(b) by 0 days.

(21) Appl. No.: 16/989,901

(22) Filed: Aug. 11, 2020

(65) Prior Publication Data

US 2021/0050061 A1    Feb. 18, 2021

Related U.S. Application Data

(60) Provisional application No. 62/886,286, filed on Aug. 13, 2019.

(51) Int. Cl.
| | |
|---|---|
| *G11C 16/16* | (2006.01) |
| *G11C 7/06* | (2006.01) |
| *G11C 7/12* | (2006.01) |
| *G11C 16/04* | (2006.01) |
| *G11C 16/10* | (2006.01) |
| *G11C 16/14* | (2006.01) |
| *G11C 16/26* | (2006.01) |
| *G11C 16/34* | (2006.01) |

(52) U.S. Cl.
CPC ............... *G11C 7/065* (2013.01); *G11C 7/12* (2013.01); *G11C 16/0433* (2013.01); *G11C 16/10* (2013.01); *G11C 16/14* (2013.01); *G11C 16/26* (2013.01); *G11C 16/3436* (2013.01); *G11C 2216/04* (2013.01)

(58) Field of Classification Search
CPC ........ G11C 7/12; G11C 16/0433; G11C 16/10
USPC .................................................. 365/185.22
See application file for complete search history.

(56) References Cited

U.S. PATENT DOCUMENTS

| | | |
|---|---|---|
| 2013/0208543 A1 | 8/2013 | Park |
| 2019/0198118 A1* | 6/2019 | Shim ................ G11C 16/30 |

* cited by examiner

*Primary Examiner* — Xiaochun L Chen
(74) *Attorney, Agent, or Firm* — Winston Hsu

(57) ABSTRACT

A method for operating a plurality of memory cells includes performing a read operation to each of the plurality of memory cells. If at least one memory cell of the plurality of memory cells is determined to be in a programmed state, perform an erasing test operation to the at least one memory cell with an initial erase voltage being applied to the erase line, and perform a verification operation to the at least one memory cell. If the cell current is smaller than the reference current, generate an intermediate erase voltage by adding a step voltage to an erase voltage currently used, and perform the erasing test operation to the at least one memory cell with the intermediate erase voltage being applied to the erase line. Performing the verification operation to the at least one memory cell again.

15 Claims, 3 Drawing Sheets

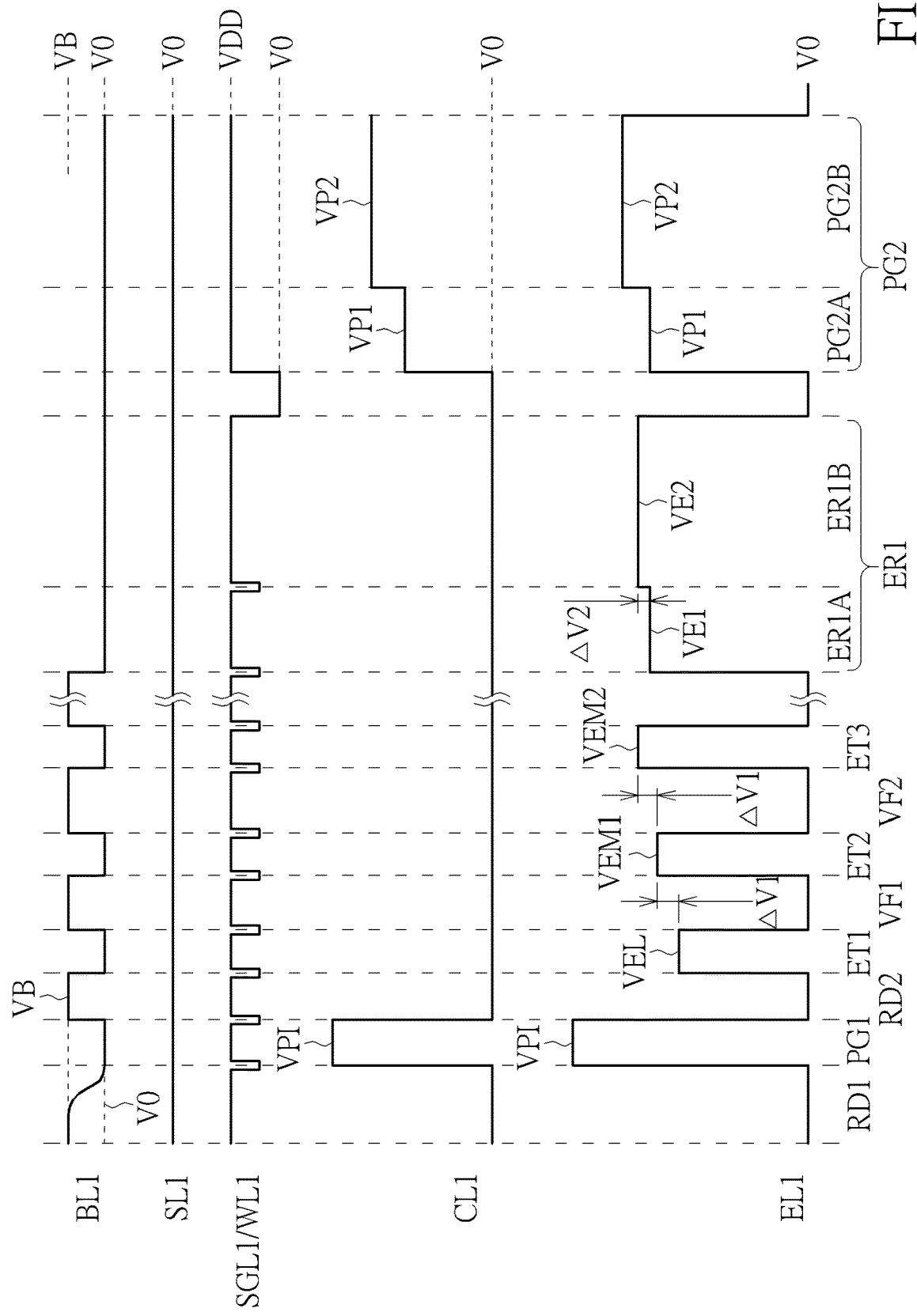

METHOD FOR DETERMINING A PROPER PROGRAM VOLTAGE FOR A PLURALITY OF MEMORY CELLS

CROSS REFERENCE TO RELATED APPLICATIONS

This non-provisional application claims priority of U.S. provisional application No. 62/886,286, filed on Aug. 13, 2019, included herein by reference in its entirety.

BACKGROUND OF THE INVENTION

1. Field of the Invention

The present invention is related to a method for operating a plurality of memory cells, and more particularly to a method for determining a proper program voltage for a plurality of memory cells.

2. Description of the Prior Art

An electrically rewritable nonvolatile memory is a type of memory that retains information it stores even when no power is supplied to memory blocks and allows on-board rewriting of a program. Due to the wide range of applications for various uses, there is a growing need for a nonvolatile memory to be embedded in the same chip with the main circuit, especially for personal electronic devices having strict requirements for circuit area.

In prior art, a floating gate transistor can be adopted in the nonvolatile memory cell for retaining data. In this case, the nonvolatile memory cell can be programmed by inducing electron tunneling and injecting electrons to the floating gate of the floating gate transistor. Also, the nonvolatile memory cell can be erased by inducing electron tunneling again and ejecting the electrons from the floating gate of the floating gate transistor. However, since the conditions for inducing electron tunneling are different for different memory cells due to the characteristic differences caused in the manufacturing process, how to determine proper program voltages and proper erase voltages to improve the efficiency of program operations and erase operations has become an important issue.

SUMMARY OF THE INVENTION

One embodiment of the present invention discloses a method for operating a plurality of memory cells. Each of the memory cells includes a control element, an erase element, and a floating gate transistor. The floating gate transistor has a first terminal, a second terminal, and a floating gate terminal coupled to a control line through the control element and coupled to an erase line through the erase element.

The method includes performing a read operation to each of the plurality of memory cells to determine if the plurality of memory cells are in an erased state or a programmed state. After the read operation is performed, if at least one memory cell of the plurality of memory cells is determined to be in a programmed state, perform an erasing test operation to the at least one memory cell with an initial erase voltage being applied to the erase line, and perform a verification operation to the at least one memory cell by comparing a cell current generated by the at least one memory cell with a reference current. After the verification operation is performed, if the cell current is smaller than the reference current, generate an intermediate erase voltage by adding a step voltage to an erase voltage currently used, perform the erasing test operation to the at least one memory cell with the intermediate erase voltage being applied to the erase line, and perform the verification operation to the at least one memory cell again.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 shows the voltages applied to the memory cell in FIG. 1 according to one embodiment of the present invention.

FIG. 3 shows the voltages applied to the memory cell in FIG. 1 according to the method in FIG. 2.

DETAILED DESCRIPTION

Figure 1:
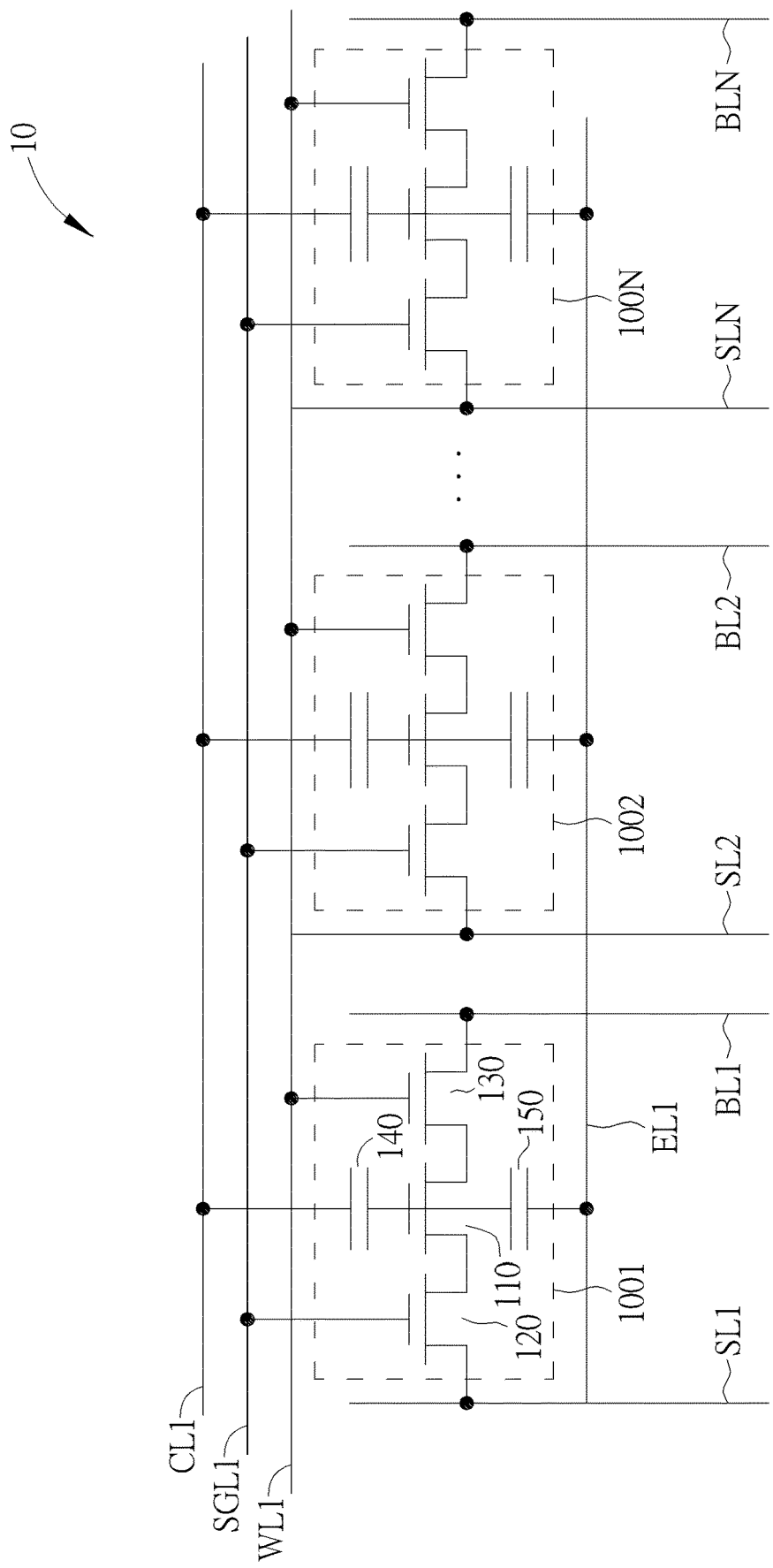
FIG. 1 shows a memory set according to one embodiment of the present invention.

FIG. 1 shows a memory set 10 according to one embodiment of the present invention. The memory set 10 includes a plurality of memory cells 1001 to 100N. The memory cells 1001 to 100N have the same structure. For example, in FIG. 1, the memory cell 1001 can include a floating gate transistor 110, a first select transistor 120, a second select transistor 130, a control element 140, and an erase element.

The floating gate transistor 110 has a first terminal, a second terminal, and a floating gate terminal. The floating gate terminal of the floating gate transistor 110 can be coupled to a control line CL1 through the control element 140 and coupled to an erase line EL1 through the erase element 150.

The first select transistor 120 has a first terminal coupled to a source line SL1, a second terminal coupled to the first terminal of the floating gate transistor 110, and a control terminal coupled to a select gate line SGL1. The second select transistor 130 has a first terminal coupled to the second terminal of the floating gate transistor 110, a second terminal coupled to a bit line BL1, and a control terminal coupled to a word line WL1.

In some embodiments, the memory set 10 can be seen as an operation unit of a memory system. For example, the memory set 10 can be seen as a word, and the memory cells 1001 to 100N can be coupled to the same word line WL1, the same select gate line SGK1, the same control line CL1, and the same erase line EL1. However, the memory cells 1001 to 100N can be coupled to different bit lines BL1 to BLN and different source lines SL1 to SLN.

Figure 2:
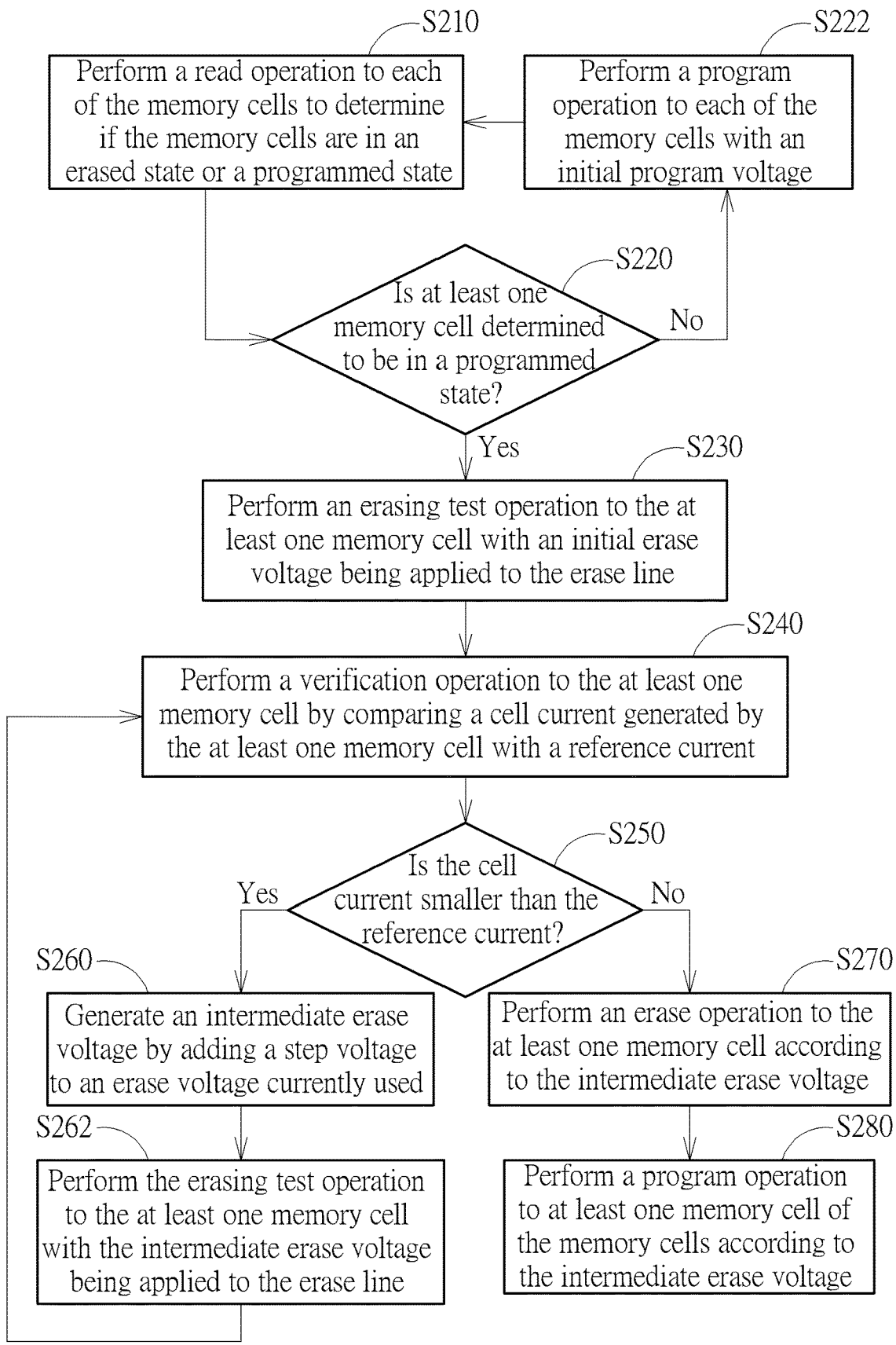
FIG. 2 shows a method for operating the memory cells in FIG. 1 according to one embodiment of the present invention.

FIG. 2 shows a method 200 for operating the memory cells 1001 to 100N according to one embodiment of the present invention. The method 200 includes steps S210 to S280.

S210: perform a read operation to each of the memory cells 1001 to 100N to determine if the memory cells 1001 to 100N are in an erased state or a programmed state;

S220: if at least one memory cell of the memory cells 1001 to 100N is determined to be in a programmed state, go to S230, else go to S222;

S222: perform a program operation to each of the memory cells 1001 to 100N with an initial program voltage, go to S210;

S230: perform an erasing test operation to the at least one memory cell with an initial erase voltage being applied to the erase line EL1;

S240: perform a verification operation to the at least one memory cell by comparing a cell current generated by the at least one memory cell with a reference current;

S250: if the cell current is smaller than the reference current, go to S260, else go to S270;

S260: generate an intermediate erase voltage by adding a step voltage to an erase voltage currently used;

S262: perform the erasing test operation to the at least one memory cell with the intermediate erase voltage being applied to the erase line EL1, go to S240;

S270: perform an erase operation to the at least one memory cell according to the intermediate erase voltage;

S280: perform a program operation to at least one memory cell of the memory cells 1001 to 100N according to the intermediate erase voltage.

In some embodiments, the method 200 can be used to determine the proper erase voltage that can erase the memory cells 1001 to 100N efficiently. Furthermore, according to the proper erase voltage, a proper program voltage that can program the memory cells 1001 to 100N can also be determined.

In step S210, a read operation can be performed to each of the memory cells 1001 to 100N to determine if the memory cells 1001 to 100N are in the erased state or the programmed state. In some embodiments, if at least one of the memory cells 1001 to 100N is in the programmed state, the erasing test operation can be performed to try to erase the programmed memory cell and to determine the proper erase voltage. However, if all of the memory cells 1001 to 100N are in the erased state, it would be difficult to determine the proper erase voltage since the erase operations cannot be performed effectively when the memory cells 1001 to 100N are already in the erased state. Therefore, in step S220, if all of the memory cells 1001 to 100N are in the erased state, then step S222 will be performed to program at least one of the memory cells 1001 to 100N.

FIG. 3 shows the voltages applied to the memory cell 1001 according to the method 200 in one embodiment of the present invention. In FIG. 3, during the period RD1 for performing the read operation in step S210, the bit line BL1 can be pre-charged to a predetermined voltage VB. Also, the source line SL1, the control line CL1, and the erase line EL1 can be applied with a reference voltage V0, and the word line WL1 and the select gate line SGL1 can be applied with an operation voltage VDD. In some embodiments, the operation voltage VDD can be greater than the predetermined voltage VB, and the predetermined voltage VB can be greater than the reference voltage V0. For example, the operation voltage VDD can be 1.6V, the predetermined voltage VB can be 1.2V, and the reference voltage V0 can be 0V.

Therefore, during the period RD1, the first select transistor 120 and the second select transistor 130 can be turned on. In this case, if the memory cell 1001 is in the erased state, then the floating gate transistor 110 will also be turned on, and a significant current will be formed to discharging the bit line BL1. However, if the memory cell 1001 is in the programmed state, then the floating gate transistor 110 will be turned off, and the bit line BL1 will remain at the predetermined voltage VB as pre-charged previously. Therefore, the state of the memory cell 1001 can be determined according to the voltage of the bit line BL1 after the bit line BL1 is pre-charged to the predetermined voltage VB and released. In some embodiments, the read operation in step S210 can be performed to the memory cells 1002 to 100N by applying the same voltages shown in the period RD1 in FIG. 3.

In FIG. 3, after the bit line BL1 is pre-charged to the predetermined voltage VB, the bit line BL1 is discharged to the reference voltage V0 during the period RD1. Therefore, the memory cell 1001 will be determined to be in the erased state in step S220. In some embodiments, if all memory cells 1001 to 100N are in the erased state, then the program operation will be performed in step S222.

In FIG. 3, during the period PG1 for performing the program operation in step S222, the bit line BL1 and the source line SL1 can be at the reference voltage V0, and the word line WL1 and the select gate line SGL1 can be at the operation voltage VDD. Also, since the proper program voltage has not been determined, an initial program voltage VPI may be applied to the control line CL1 and the erase line EL1 during the period PG1. In some embodiments, to ensure the memory cells 1001 to 100N can be programmed, the initial program voltage VPI is usually set to be higher than the proper program voltage determined later.

In this case, the floating gate terminal of the floating gate transistor 110 will be coupled to the initial program voltage VPI through the control element 140 and the erase element 150. Thus, the great voltage applied to the floating gate transistor 110 may induce Fowler-Nordheim (FN) tunneling, and the electrons would be injected to the floating gate of the floating gate transistor 110.

After the program operation is performed in step S222, the read operation will be performed again in step S210. In FIG. 3, during the period RD2, since the voltage of the bit line BL1 remains at the predetermined voltage VB, the memory cell 1001 is determined to be in the programmed state in S220 so the erasing test operation will be performed in step S230 next.

In FIG. 3, during the period ET1, the erasing test operation in step S230 can be performed by applying the reference voltage V0 to the source line SL1, the bit line BL1 and the control line CL1, applying the operation voltage VDD to the word line WL1 and the select gate line SGL1, and applying the initial erase voltage VEI to the erase line EL1. In some embodiments, the initial erase voltage VEI can be greater than the operation voltage VDD. For example, the initial erase voltage VEI can be 8V.

In this case, since the coupling ratio of the erase element 150 is smaller than the coupling ratio of the control element 140, the floating gate terminal of the floating gate transistor 110 will not be coupled to the initial erase voltage VEI. Instead, the electrons trapped in the floating gate of the floating gate transistor 110 may be attracted by the high voltage on the erase line EL1. In some embodiments, if the initial erase voltage VEI is high enough, then FN tunneling may be induced and the electrons would be ejected from the floating gate of the floating gate transistor 110 to the erase line EL1 through the erase element 150. However, if the initial erase voltage VEI is not high enough, then FN tunneling will not be induced, and the memory cell 1001 would remain in the programmed state.

In the method 200, the result of the erasing test operation can be derived by performing the verification operation in step S240. In FIG. 3, during the period VF1, the verification operation can be performed by applying the predetermined voltage VB to the bit line BL1, applying the reference voltage V0 to the source line SL1, the control line CL1, and the erase line EL1, and applying the operation voltage VDD to the word line WL1 and the select gate line SGL1. In this case, the cell current generated by the memory cell 1001 on the bit lien BL1 during the period VF1 can be compared with a reference current. In some embodiments, the cell current on the bit line BL1 can be compared with the reference current by using a sense amplifier. If the cell current on the bit line BL1 is determined to be greater than the reference current, it may imply that the erasing test operation just performed is rather effective, and the voltage applied to the erase line EL1 may be a proper voltage for erase operations. However, if the cell current on the bit line BL1 is determined to be smaller than the reference current, it may imply that the erasing test operation just performed is not effective, and the proper voltage for erase operations should be higher.

In the present embodiment, since the cell current is smaller than the reference current, the initial erase voltage would be increased to generate an intermediate erase voltage to perform the erasing test operation again. That is, in step S260, the intermediate erase voltage VEM1 can be generated by adding a step voltage $\Delta V1$ to the initial erase voltage VEI, and the erasing test operation will be performed again with the intermediate erase voltage VEM1 being applied to the erase line EL1 as shown in the period ET2 in FIG. 3. In some embodiments, the step voltage $\Delta V1$ can be, for example but not limited to, 0.5V.

After the erasing test operation, the verification operation will be performed again as indicated in step S240 to see if the cell current becomes greater than the reference current in step S250. In the present embodiment, in the period VF2 of FIG. 3, since the cell current is still smaller than the reference current, step S260 will be performed again to further increase the intermediate erase voltage VEM1 by adding the step voltage $\Delta V1$. Therefore, the erasing test operation performed in step S262 will apply the increased intermediate erase voltage VEM2 as shown in the period ET3 in FIG. 3.

That is, steps S240 to S262 may be performed several times, and the intermediate erase voltage will be increased gradually until the cell current finally becomes greater than the reference current. According to the method 200, if the cell current is determined to be greater than the reference current in step S250, it may imply that the intermediate erase voltage currently used is a proper voltage for performing the erase operation. Furthermore, since the erasing test operations are performed to check the erasing efficiency of the erase voltages being used, the durations of the erasing test operations may not be long enough to fully erase the memory cell 1001. Therefore, in step S270, the erase operation will be performed to the memory cell 1001 according to the intermediate erase voltage VEM2.

In FIG. 3, during the period ER1, the erase operation in step S270 can be performed by generating a first erase voltage VE1 according to the intermediate erase voltage VEM2, applying the first erase voltage VE1 to the erase line EL1 for a first period of time ER1A, generating a second erase voltage VE2 according to the intermediate erase voltage VEM2, and after the first period of time ER1A, applying the second erase voltage VE2 to the erase line EL2 for a second period of time ER1B. In some embodiments, the first erase voltage VE1 can be set to be smaller than the intermediate erase voltage VEM2 applied lastly, and the second erase voltage VE2 can be greater than the first erase voltage VE1. Also, the second period of time ER1B can be longer than the first period of time ER1A. For example, the first erase voltage VE1 can be smaller than the intermediate erase voltage VEM2 by a step voltage $\Delta V2$, and the second erase voltage VE2 can be the same as the intermediate erase voltage VEM2. In some embodiments, the step voltage $\Delta V1$ can be, for example but not limited to, two times of the step voltage $\Delta V2$.

By performing the erase operation with multiple steps, the efficiency of the erase operation can be improved. However, in some other embodiments, the erase operation in step S270 may include only one step and set the erase voltage VE1 to be substantially equal to the intermediate erase voltage VEM2. Or, in some other embodiments, the erase operation in step S270 may include even more steps, and may determine the erase voltages for the multiple steps based on the intermediate erase voltage VEM2 according to the system requirement. Furthermore, in some embodiments, to ensure the erase operation can be performed effectively, the duration of the erase operation in step S270 can be longer than the duration of the erasing test operations performed in S230 and S262.

In some embodiments, the proper erase voltage used in step S270 can also be used as the program voltage. For example, if a write command is received, and the memory cell 1001 is determined to be programmed, then step S280 would be performed to program the memory cell 1001 according to the intermediate erase voltage VEM2. In FIG. 3, during the period PG2, the program operation can be performed by generating a first program voltage VP1 according to the intermediate erase voltage VEM2, applying the first program voltage VP1 to the control line CL1 for a first period of time PG2A, generating a second program voltage VP2 according to the intermediate erase voltage VEM2, and after the first period of time PG2A, applying the second program voltage VP2 to the control line CL1 for a second period of time PG2B.

In some embodiments, the program operation may adopt a voltage slightly smaller than the proper erase voltage for programming. Therefore, the first program voltage VP1 may be smaller than the intermediate erase voltage VEM2. However, after the first period of time PG1A, memory cell 1001 may trap some electrons, and the threshold voltage of the floating gate transistor 110 is raised. Therefore, to maintain the efficiency of the program operation, the second program voltage VP2 may be set to be greater than the first program voltage VP1. Also, in some embodiments, the second period of time PG2B can be longer than the first period of time PG2A.

In some embodiments, by performing the program operation with multiple steps, the efficiency of the program operation can be improved. However, in some other embodiments, the program operation in step S280 may include only one step and set the program voltage VP1 to be substantially equal to or smaller than the intermediate erase voltage VEM2. Or, in some other embodiments, the program operation in step S280 may include even more steps, and may determine the program voltages to be used based on the intermediate erase voltage VEM2 according to the system requirement.

Consequently, with the method 200, the proper erase voltage and the proper program voltage can both be determined efficiently during the erasing process, reducing the power consumption for searching for the erase voltage and the program voltage separately in prior art. Since the method 200 can be performed for all memory cells in the memory set 10, and can be performed whenever required, the memory cells can be erased and programmed effectively with the suitable voltages. Also, in some embodiments, the similar principle can be used to determine the proper program voltage during the programming process, and to determine the proper erase voltage accordingly.

In summary, the method for operating the memory cells provided by the embodiments of the present invention can determine the proper erase voltage and the proper program voltage efficiently, reducing the power consumption. Also, since the erase voltage and the program voltage can be determined according to the system requirement, the memory cells can always be erased and programmed with the suitable voltages effectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for operating a plurality of memory cells each comprising a control element, an erase element, and a floating gate transistor having a first terminal, a second terminal, and a floating gate terminal, the floating gate terminal of the floating gate transistor being coupled to a control line through the control element and coupled to an erase line through the erase element, the method comprising:
   performing a read operation to each of the plurality of memory cells to determine if the plurality of memory cells are in an erased state or a programmed state;
   after the read operation is performed, if at least one memory cell of the plurality of memory cells is determined to be in a programmed state, performing an erasing test operation to the at least one memory cell with an initial erase voltage being applied to the erase line;
   performing a verification operation to the at least one memory cell by comparing a cell current generated by the at least one memory cell with a reference current;
   after the verification operation is performed, if the cell current is smaller than the reference current:
      generating an intermediate erase voltage by adding a step voltage to an erase voltage currently used;
      performing the erasing test operation to the at least one memory cell with the intermediate erase voltage being applied to the erase line; and
      performing the verification operation again to the at least one memory cell.

2. The method of claim 1 further comprising:
   after the read operation is performed if all of the plurality of memory cells are determined to be in the erased state, performing a program operation to each of the plurality of memory cells with an initial program voltage; and
   performing the read operation to each of the plurality of memory cells again.

3. The method of claim 1 further comprising:
   after the verification operation is performed again, if the cell current is greater than the reference current, performing an erase operation to the at least one memory cell according to the intermediate erase voltage.

4. The method of claim 3, wherein a duration of the erase operation is longer than a duration of the erasing test operation.

5. The method of claim 3, wherein after the verification operation is performed again, if the cell current is greater than the reference current, performing the erase operation to the at least one memory cell according to the intermediate erase voltage comprises:
   generating a first erase voltage according to the intermediate erase voltage;
   applying the first erase voltage to the erase line for a first period of time;
   generating a second erase voltage according to the intermediate erase voltage; and
   after the first period of time, applying the second erase voltage to the erase line for a second period of time.

6. The method of claim 5, wherein the second period of time is longer than the first period of time.

7. The method of claim 5, wherein the first erase voltage is smaller than or substantially equal to the intermediate erase voltage, and the second erase voltage is greater than the first erase voltage.

8. The method of claim 3, further comprising:
   after the erase operation is performed, performing a program operation to at least one memory cell of the plurality of memory cells according to the intermediate erase voltage.

9. The method of claim 8, wherein after the erase operation is performed, performing the program operation to the at least one memory cell of the plurality of memory cells according to the intermediate erase voltage comprises:
   generating a first program voltage according to the intermediate erase voltage;
   applying the first program voltage to the control line for a first period of time;
   generating a second program voltage according to the intermediate erase voltage; and
   after the first period of time, applying the second program voltage to the control line for a second period of time.

10. The method of claim 9, wherein the second period of time is longer than the first period of time.

11. The method of claim 9, wherein the first program voltage is smaller than or substantially equal to the intermediate erase voltage, and the second program voltage is greater than the first program voltage.

12. The method of claim 1, wherein each of the plurality of memory cells further comprises:
   a first select transistor having a first terminal coupled to a source line, a second terminal coupled to the first terminal of the floating gate transistor, and a control terminal coupled to a select gate line; and
   a second select transistor having a first terminal coupled to the second terminal of the floating gate transistor, a second terminal coupled to a bit line, and a control terminal coupled to a word line.

13. The method of claim 12, wherein performing the read operation to each of the plurality of memory cells to determine if the plurality of memory cells are in the erased state or the programmed state comprises:
   pre-charging the bit line to a predetermined voltage;
   applying a reference voltage smaller than the predetermined voltage to the source line, the control line, and the erase line;
   applying an operation voltage greater than the predetermined voltage to the word line and the select gate line; and
   determining if the plurality of memory cells are in the erased state or the programmed state according to a voltage of the bit line after the bit line is pre-charged to the predetermined voltage.

14. The method of claim 12, wherein performing the verification operation to the at least one memory cell by comparing the cell current generated by the at least one memory cell with the reference current comprises:
   applying a predetermined voltage to the bit line;

applying a reference voltage smaller than the predetermined voltage to the source line, the control line, and the erase line;

applying an operation voltage greater than the predetermined voltage to the word line and the select gate line; and comparing the cell current on the bit line with the reference current.

15. The method of claim 12, wherein after the read operation is performed, if the at least one memory cell of the plurality of memory cells is determined to be in the programmed state, performing the erasing test operation to the at least one memory cell with the initial erase voltage being applied to the erase line comprises:

applying a reference voltage to the source line and the bit line;

applying an operation voltage greater than the reference voltage to the word line and the select gate line; and applying the initial erase voltage to the erase line.

* * * * *